United States Patent [19]
Jaquette

[11] Patent Number: 6,008,743
[45] Date of Patent: Dec. 28, 1999

[54] METHOD AND APPARATUS FOR SWITCHING BETWEEN DATA COMPRESSION MODES

[75] Inventor: Glen Alan Jaquette, Tucson, Ariz.

[73] Assignee: International Business Machines Corporation, Armonk, N.Y.

[21] Appl. No.: 08/974,199

[22] Filed: Nov. 19, 1997

[51] Int. Cl.$^6$ .............................. H03M 7/30; G06F 5/00
[52] U.S. Cl. ............................... 341/51; 710/68
[58] Field of Search .............................. 710/68; 395/888; 341/50, 51, 55, 56, 60, 59, 63, 65, 67, 87, 90, 106

[56] References Cited

U.S. PATENT DOCUMENTS

| | | | |
|---|---|---|---|
| 3,784,737 | 1/1974 | Waehner | 178/6 |
| 5,177,480 | 1/1993 | Clark | 341/51 |
| 5,373,290 | 12/1994 | Lempel et al. | 341/51 |
| 5,455,576 | 10/1995 | Clark, II et al. | 341/50 |
| 5,561,824 | 10/1996 | Carreiro et al. | 341/51 |
| 5,608,396 | 3/1997 | Cheng et al. | 341/50 |
| 5,648,773 | 7/1997 | Guy | 341/51 |
| 5,652,878 | 7/1997 | Craft | 395/601 |
| 5,815,097 | 9/1998 | Schwartz et al. | 341/51 |

FOREIGN PATENT DOCUMENTS

| | | |
|---|---|---|
| 403272289A | 12/1991 | Japan . |
| 404324778A | 11/1992 | Japan . |
| 406237284A | 8/1994 | Japan . |
| 407261977A | 10/1995 | Japan . |

OTHER PUBLICATIONS

'The Data Compression Book', Mark Nelson, M & T Publishing, 1991, pp. 277–311.

*Primary Examiner*—Xuan M. Thai
*Attorney, Agent, or Firm*—John H. Holcombe; Robert M. Sullivan

[57] ABSTRACT

Disclosed are a method and apparatus for switching between lossless data compression modes, and the switching indicated by at least one multibit mode switch character. The binary format input data is received and a FIFO determination of the compression efficiency of the input data under each mode is made on an ongoing basis. The ongoing basis may be for each compressed code word or more. A FIFO comparison of the compression efficiencies under each mode are made, and the modes for compressing the input data are switched only upon the comparison, or accumulated comparisons, indicating the compression efficiency of the present mode is less than the compression efficiency of the other mode by a threshold value, the threshold value directly related to the number of bits in the multibit mode switch character. One or both of the data compression modes may comprise a Lempel-Ziv compression, such as ALDC (LZ-1 derivative) or DCLZ (LZ-2 derivative), for compressing the input data into variable sized tokens, and the FIFO compression efficiency may be determined based on the bit length of each variable sized token.

24 Claims, 6 Drawing Sheets

ALDC-2 output possibilities:
- 9 bit literal=0.(8 bit data byte)
- variable length backward reference
  = 1.(variable length match length code).(10 bit match location)

| match length codes | backward reference length | savings |
|---|---|---|
| 00 = 2 bytes | 13 bits | 3 |
| 01 = 3 bytes | 13 bits | 11 |
| 1000 = 4 bytes | 15 bits | 17 |
| 1001 = 5 bytes | 15 bits | 25 |
| 1010 = 6 bytes | 15 bits | 33 |
| 1011 = 7 bytes | 15 bits | 41 |
| 110000 = 8 bytes | 17 bits | 47 |
| 110001 = 9 bytes | 17 bits | 55 |

- 13 bit control codes = 1.1111.1111.(four bit code)
  1.1111.1111.0010 = swap to scheme 2

*FIG. 4A*

Passthrough mode:
- for every data byte possibility except for FFh, the data is simply output unmodified.
- FFh in is output as 1111.1111.0
- the control code is 1111.1111.1.(four bit code)
  1111.1111.1.0001 = swap to scheme 1 (ALDC-2)

*FIG. 4B*

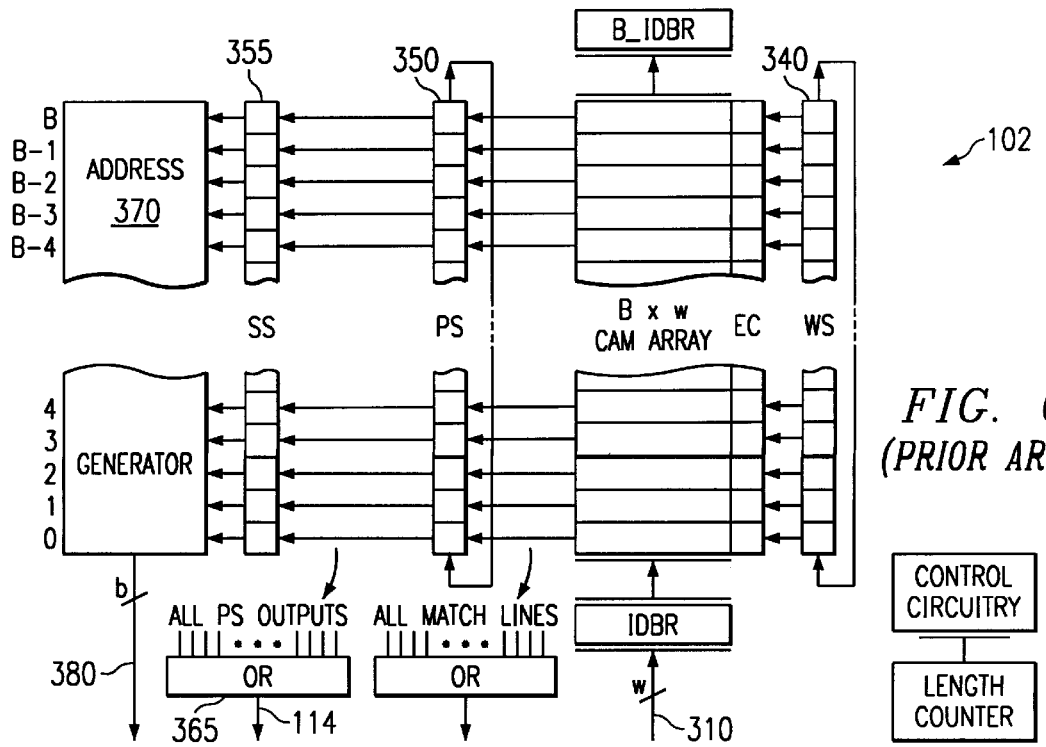

*FIG. 6 (PRIOR ART)*

Scenario A, string received "Mississuppi abcdefghijklmnopqrstuv is her Missis"

| Input | Output as | This Count | Cumm Count | Toggle | Tentative Scheme | State | Criteria Met | FIFO |
|---|---|---|---|---|---|---|---|---|
| (initial state) | | 0 | 0 | 0 | 1 | 1 | 0 | |
| M | Literal | +1 | 1 | 1 | 2-1 | 1 | 0 | |
| i | Literal | +1 | 2 | 0 | 2-1 | 1 | 0 | |
| s | Literal | +1 | 3 | 1 | 2-1 | 1 | 0 | |
| s | Literal | +1 | 4 | 0 | 2-1 | 1 | 0 | |
| i | Ref1, 1st B | 0 | 4 | 1 | 2-1 | 1 | 0 | |
| s | Ref1, 2nd B | -3 | 1 | 1 | 2-1 | 1 | 0 | |
| s | Ref1, 3rd B | -8 | 0 * | 1 | 1-^ ** | 1 | 0 | |
| u | Literal | +1 | 1 | 0 | 2 | 1 | 0 | 1 |
| p | Literal | +1 | 2 | 1 | 2 | 1 | 0 | 2 |
| p | Literal | +1 | 3 | 0 | 2 | 1 | 0 | 3 |
| i | Literal | +1 | 4 | 1 | 2 | 1 | 0 | 4 |
| | Literal | +1 | 5 | 0 | 2 | 1 | 0 | 5 |
| a | Literal | +1 | 6 | 1 | 2 | 1 | 0 | 6 |
| b | Literal | +1 | 7 | 0 | 2 | 1 | 0 | 7 |
| c | Literal | +1 | 8 | 1 | 2 | 1 | 0 | 8 |
| d | Literal | +1 | 9 | 0 | 2 | 1 | 0 | 9 |
| e | Literal | +1 | 10 | 1 | 2 | 1 | 0 | 10 |
| f | Literal | +1 | 11 | 0 | 2 | 1 | 0 | 11 |
| g | Literal | +1 | 12 | 1 | 2 | 1 | 0 | 12 |
| h | Literal | +1 | 13 | 0 | 2 | 1 | 0 | 13 |
| i | Literal | +1 | 14 | 1 | 2 | 1 | 0 | 14 |
| j | Literal | +1 | 15 | 0 | 2 | 1 | 0 | 15 |
| k | Literal | +1 | 16 | 1 | 2 | 1 | 0 | 16 |
| l | Literal | +1 | 17 | 0 | 2 | 1 | 0 | 17 |
| m | Literal | +1 | 18 | 1 | 2 | 1 | 0 | 18 |
| n | Literal | +1 | 19 | 0 | 2 | 1 | 0 | 19 |
| o | Literal | +1 | 20 | 1 | 2 | 1 | 0 | 20 |
| p | Literal | +1 | 21 | 0 | 2 | 1 | 0 | 21 |
| q | Literal | +1 | 22 | 1 | 2 | 1 | 0 | 22 |
| r | Literal | +1 | 23 | 0 | 2 | 1 | 0 | 23 |
| s | Literal | +1 | 24 | 1 | 2 | 1 | 0 | 24 |
| t | Literal | +1 | 25 | 0 | 2 | 1 | 0 | 25 |
| u | Literal | +1 | 26 | 1 | 2 | 2 | 0 | 26 |
| v | Literal | +1 | 26 * | 0 | 2 | 2 | 0 | 27 |
| | Literal | +1 | 26 * | 1 | 2 | 2 | 0 | 28 |
| i | Ref2, 1st B | 0 | 26 | 0 | 1-2 | 2 | 0 | 29 |
| s | Ref2, 2nd B | -3 | 23 | 0 | 1-2 | 2 | 0 | 30 |
| | Literal | +1 | 24 | 1 | 1-2 | 2 | 0 | 31 |
| h | Literal | +1 | 25 | 0 | 1-2 | 2 | 0 | 32 |
| e | Literal | +1 | 26 | 1 | 2-^ ** | 2 | 0 | |
| r | Literal | +1 | 26 * | 0 | 2 | 2 | 0 | |
| | Literal | +1 | 26 * | 1 | 2 | 2 | 0 | |
| M | Ref3, 1st B | 0 | 26 | 0 | 1 | 2 | 0 | |
| i | Ref3, 2nd B | -3 | 23 | 0 | 1 | 2 | 0 | |
| s | Ref3, 3rd B | -8 | 15 | 0 | 1 | 2 | 0 | |
| s | Ref3, 4th B | -6 | 9 | 0 | 1 | 2 | 0 | |
| i | Ref3, 5th B | -8 | 1 | 0 | 1 | 2 | 0 | |
| s | Ref3, 6th B | -8 | 0 * | 0 | 1 | 1 | 1 | |

FIG. 7

Scenario B, string received "Mississuppi abcdefghijklmnopqrst abc/ab" as in Scenario A until:

| Input | Output as | This Count | Cumm Count | Toggle | Tentative Scheme | State | Criteria Met | FIFO |
|---|---|---|---|---|---|---|---|---|
| t | Literal | +1 | 25 | 0 | 2-1 | 1 | 0 | 25 |
|  | Ref2, 1st B | 0 | 25 | 1 | 2-1 | 1 | 0 | 26 |
| a | Ref2, 2nd B | -3 | 22 | 1 | 2-1 | 1 | 0 | 27 |
| b | Ref2, 3rd B | -8 | 14 | 1 | 2-1 | 1 | 0 | 28 |
| c | Ref2, 4th B | -6 | 8 | 1 | 2-1 | 1 | 0 | 29 |
| / | Literal | +1 | 9 | 0 | 2-1 | 1 | 0 | 30 |
| a | Ref1, 1st B | 0 | 9 | 1 | 2-1 | 1 | 0 | 31 |
| b | Ref1, 2nd B | -3 | 6 | 1 | 2-1 | 1 | 0 | 32 |

*FIG. 8*

Scenario C, string received "Mississuppi abcdefghijklmnopqrst abc/xy" as in Scenario A until:

| Input | Output as | This Count | Cumm Count | Toggle | Tentative Scheme | State | Criteria Met | FIFO |
|---|---|---|---|---|---|---|---|---|
| t | Literal | +1 | 25 | 0 | 2 | 1 | 0 | 25 |
|  | Ref2, 1st B | 0 | 25 | 1 | 2 | 1 | 0 | 26 |
| a | Ref2, 2nd B | -3 | 22 | 1 | 2 | 1 | 0 | 27 |
| b | Ref2, 3rd B | -8 | 14 | 1 | 2 | 1 | 0 | 28 |
| c | Ref2, 4th B | -6 | 8 | 1 | 2 | 1 | 0 | 29 |
| / | Literal | +1 | 9 | 0 | 2 | 1 | 0 | 30 |
| x | Literal | +1 | 10 | 1 | 2 | 1 | 0 | 31 |
| y | Literal | +1 | 11 | 0 | 2 | 1 | 0 | 32 |

*FIG. 9*

METHOD AND APPARATUS FOR SWITCHING BETWEEN DATA COMPRESSION MODES

TECHNICAL FIELD

This invention relates to lossless data compression systems, and, more particularly, to switching between data compression modes by comparing the compression efficiencies of the data compression modes.

BACKGROUND OF THE INVENTION

With the continued growth in demand for data transmission and data storage capacities, improved lossless data compression techniques are continually sought. As described in coassigned U.S. Pat. No. 5,652,878, of the many classes of lossless data compression, one of the most useful is the class of dictionary based compression techniques. Among these, the most useful today are the so-called Ziv-Lempel variable-length encoding procedures ascribed to J. Ziv and A. Lempel who suggested the "LZ1" length offset encoding scheme. The LZ1 process uses a fixed size sliding "history" window into the past source data string as the dictionary. Matches are encoded as a "match length" and an "offset" from an agreed position.

Because LZ1 scrolls the source string over a fixed sized sliding history window to create an adaptive dictionary, identification of duplicate "matching" strings in the source data is at first difficult, but becomes very efficient. Once a matching string is encoded as a "length" and "offset", the necessary decoding process is rapid and efficient, requiring no dictionary preload. The '878 patent illustrates an LZ1 compression technique which has been denominated the "adaptive lossless data compression" technique, or "ALDC".

All sliding window data compression processes suffer from what may be called "start-up losses" and "non-redundancy losses" in compression efficiency. Because each source string or block begins with an empty "dictionary", the first source symbols must be transmitted as raw words without compression. Similarly, a string of input data which has already been encrypted or compressed and lacks substantial redundancy, lacks the matches required for compression and the source symbols must also be transmitted as raw words without compression. The raw words must be identified as such by adding a bit for ALDC, the resultant characters called "literals", thereby leading to an expansion of the data.

Only after accumulating a substantial dictionary, by having the sliding window fill up with input data having substantial redundancy, are matches found for increasing numbers of substrings which allow encoding efficiency to build up.

In the original LZ1 arrangement, called "LZ77", all source input is output in the form of a three part token having the length and offset together with a flag, which is the first character of the compressed substring. Techniques such as ALDC overcome the problem when a non-redundant character is encountered by not sending the three part token, but instead providing the character unchanged, and providing it with a designation to indicate that it is not compressed. The unchanged raw character together with the designation is called a "literal". A typical designation is an added "zero" bit for each word of the source string. Thus, when encountering a string of non-redundant input data, the compression is expanded by a much smaller length than is likely with the original LZ1 technique. However, LZ1 techniques such as ALDC still must actually expand the data by one bit for every word, typically a 9/8 expansion to output them as literals.

Because of this problem, alternative dictionary based compression techniques have been designed to offer special advantages in particular circumstances. An example is LZ2 compression (also known as LZ78 or the related version known as LZW) which captures redundancies and maintains them in a dictionary for, e.g., an entire record, as described in "The Data Compression Book", M. Nelson, M & T Publishing, 1991, pp. 277–311. Thus, the opportunity for having redundancies is expanded, albeit at the cost of an expanded dictionary buffer. In LZ2, the expansion for literals may be more than one bit.

Another alternative is to not compress the data where expansion is a significant risk, which may be called "passthrough" mode.

In the situation where a string of non-redundant input data is encountered, it would be useful to switch to a second compression technique which may handle the strings of non-redundant input data more efficiently than the 9/8 expansion required to output them as literals.

Multibit control codes may be provided in the output data to indicate a special situation in data handling techniques, and that such a special situation may include switching between compression modes. If such a control code is used, it will degrade the efficiency of the compression by the length of the character.

The determination that it would be advantageous to make the switch is difficult. Coassigned U.S. Pat. No. 5,561,824 applies a total length data record concurrently to a compressor and a buffer. If the compressed record is expanded over the uncompressed record, the uncompressed record, and the entire following string of records, are selected for recording. The use of such a gross technique requires large buffering and lacks efficiency if the input data has any intermix of non-redundant input data and redundant data.

An alternative approach may be to examine the compressed data for a predetermined length of data and, if no compression has occurred, for example a long string of literals has been output, to then switch compression techniques. The difficulty with such an approach is that it would be very easy to get out of step with the input data and employ each technique at the wrong time.

SUMMARY OF THE INVENTION

An object of the present invention is to switch between lossless data compression modes on a high efficiency basis.

Disclosed are a method and apparatus for switching between lossless data compression modes, and the switching indicated by at least one multibit mode switch character. The binary format input data is received and a FIFO determination of the compression efficiency of the input data under each mode is made on an ongoing basis. The ongoing basis may be for each compressed code word or more. A FIFO comparison of the compression efficiencies under each mode are made, and the modes for compressing the input data are switched only upon the comparison indicating the compression efficiency of the present mode is less than the compression efficiency of the other mode by a threshold value, the threshold value directly related to the number of bits in the multibit mode switch character.

The comparisons may be accumulated over the full FIFO length and a switch made only upon the accumulated value reaching the threshold. Multiple threshold values may be employed, for example, a threshold value "A" for less than the full FIFO length or a lesser threshold value "B" upon reaching the full FIFO length.

One or both of the data compression modes may comprise a dictionary based compression, such as a Lempel-Ziv compression, for compressing the input data into variable sized tokens, and the FIFO compression efficiency may be determined based on the bit length of each variable sized token.

For a fuller understanding of the present invention, reference should be made to the following detailed description taken in conjunction with the accompanying drawings.

BRIEF DESCRIPTION OF THE DRAWINGS

FIGS. 4A and 4B are tables indicating exemplary output codes of ALDC and of passthrough data compression modes modified in accordance with the present invention;

FIG. 6 is a block diagram of the prior art ALDC LZ1 CAM data compressor employed in the apparatus of FIG. 5; and FIGS. 7, 8 and 9 are exemplary scenarios of input data illustrating operation of the apparatus of FIG. 5.

DETAILED DESCRIPTION OF THE INVENTION

Figure 1:
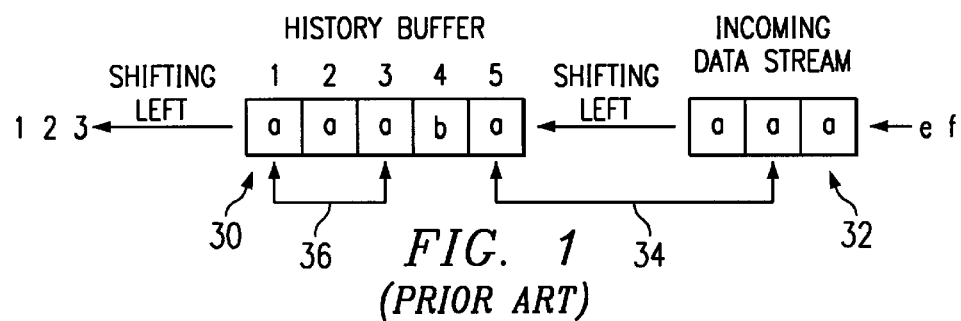
FIG. 1 is a block diagram of a sliding window LZ1 data compression system of the prior art.

Referring to FIG. 1, the prior art LZ1 compression procedure replaces a redundant substring of source symbols with a pointer to an earlier occurrence of the same substring, called a "sliding window". Data compression occurs when the pointer representation is coded to fewer bits than the replaced source symbol substring.

In the simplified example of FIG. 1, the scheme employs a sliding window history buffer 30 with five words of capacity and a look ahead buffer 32 with three words of capacity. The first encoder task is to find the longest prefix match of the string in the look ahead buffer 32 that has an exact match in buffer 30. The length of the longest match is one part of the token provided by the encoder, and the position or offset in buffer 30 where the match is located is the other part of the token provided by the encoder. In FIG. 1, the input data string of 8-bit bytes "123aaabaaaaef" is shown in transit through buffers 30 and 32. With the buffer contents shown, the encoder match detector finds a match for "aaa" of buffer 32 at two different offsets. The first match 34 is found at offset 5 and the second match 36 is found at offset 1. Thus, the three bytes or characters "aaa" in buffer 32 may be replaced with a token having as a flag, length and offset of either [1, 3, 5] or [1, 3, 1].

The flag bit is required to distinguish between encoded output and a literal. Thus, each compressed data token has an added "1" flag bit, and every byte which is a literal has an added "0" flag bit.

Every literal in the ALDC format therefore expands the input data by 1 bit for every 8 bit byte, an expansion of 12.5%.

As described above, when a sequence of non-redundant data is encountered, it would be advantageous to switch to an alternative data compression mode that could handle and either compress or reduce the expansion of the data.

One example of an alternative data compression mode is the LZ2 mode, discussed above, such as DCLZ, an LZ2 derivative. Briefly, LZ2 expands the dictionary beyond that of the sliding window history buffer by maintaining a dictionary of matches that have occurred previously in the document. Therefore, the potential for compression is increased. The processing time is also reduced for matches to the dictionary since the entire history buffer need not be searched. Once the matches to the dictionary have been utilized, however, and new input data appears, the LZ2 mode is reduced in efficiency because the dictionary still must be searched continually. Thus, it might be advantageous to return to an LZ1 ALDC process to begin to find redundancies in the input data without referring constantly to the dictionary.

An alternative data compression mode may comprise the "passthrough" mode, mentioned above. Passthrough may simply transmit the input data as words which are not changed from the input data.

It is known to provide multibit control codes in the output data to indicate a special situation in data handling techniques. Such a special situation may include switching between compression modes. If such a control code is used, it will degrade the efficiency of the compression by the length of the character.

In addition, a control code must not be the same as a word or token from either of the data compression modes, to allow proper decoding. For example, since passthrough mode could allow any sequence of bits appearing at the input to be provided at the output, one of the output words must be reserved for the control code. Assuming that the passthrough output is in the form of a word comprising one 8-bit hex byte, one of the words, for example "FF", may be reserved for the control code. Thus, "FF.0" may indicate that the "FF" is actually a literal and should not be considered a control code, and "FF.1" may indicate the control code.

Further, the control code may be particularized to indicate the direction of the compression mode switching, or to indicate other special data handling by appending additional bits to the control code, such as another byte or partial byte of information.

Figure 2:
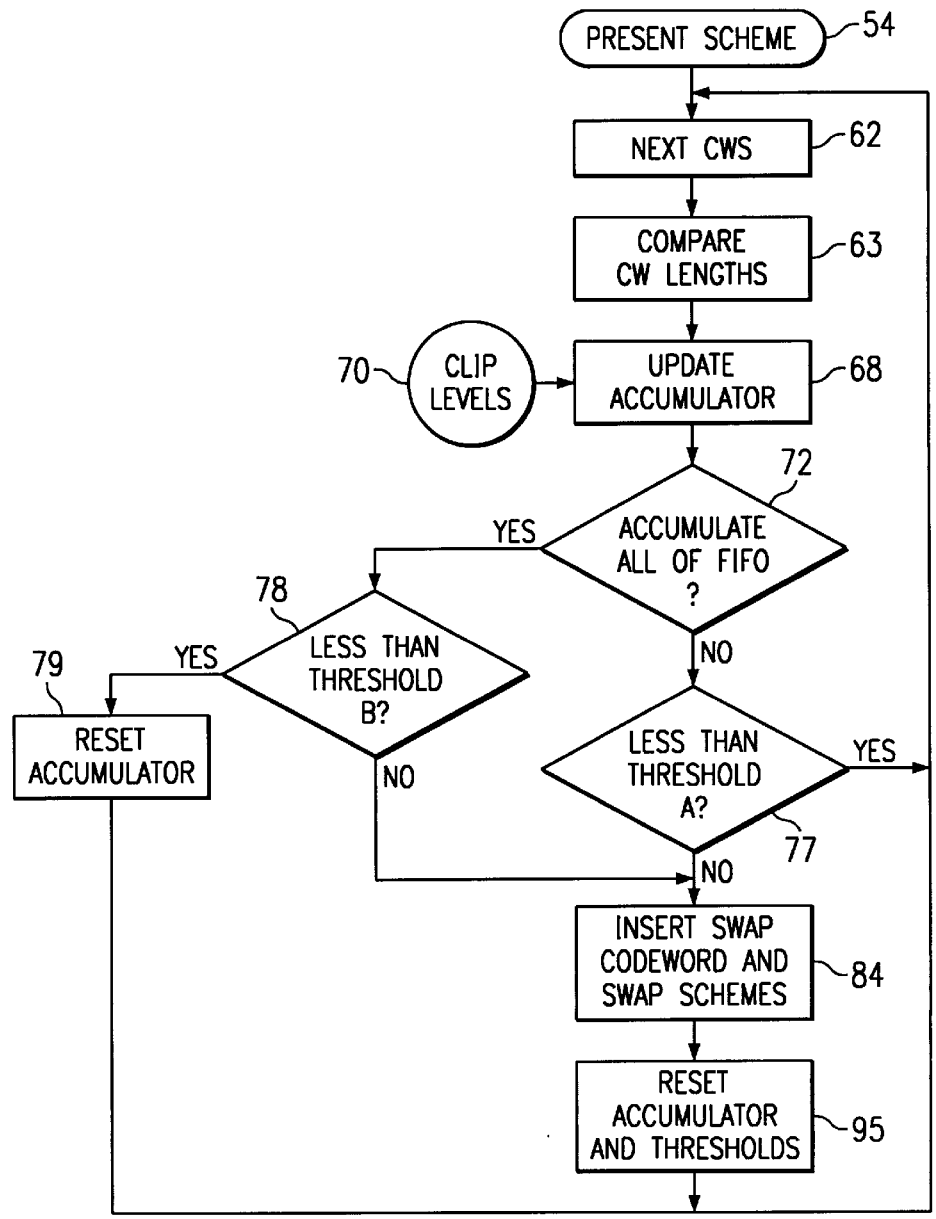
FIG. 2 is a flow chart depicting the method for switching between lossless data compression modes of the present invention.
Figure 3:
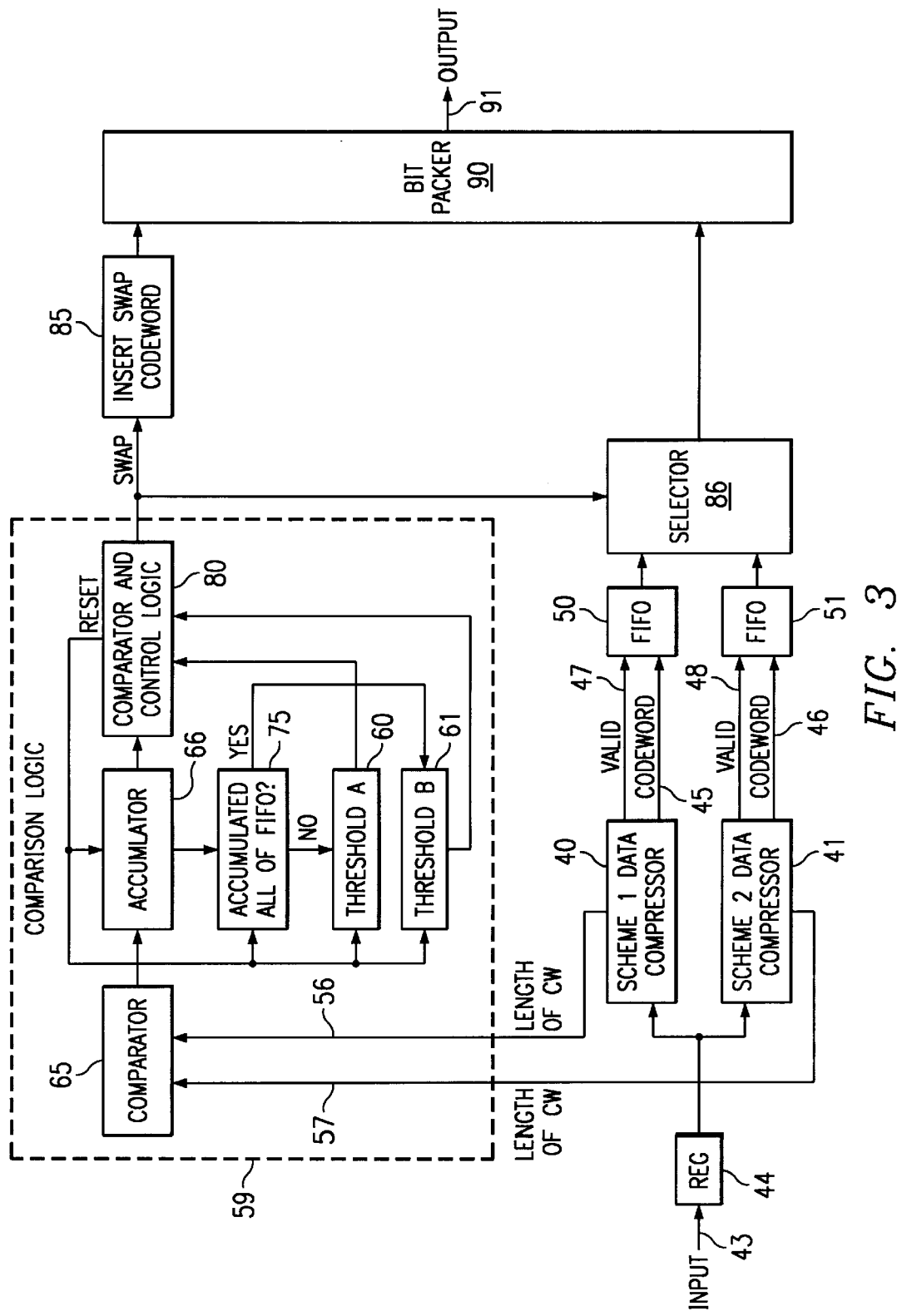
FIG. 3 is a block diagram of the apparatus for switching between lossless data compression modes implementing the method of FIG. 2.

FIGS. 2 and 3 illustrate one embodiment of the present invention for switching between lossless data compression modes. The two data compression modes are depicted in FIG. 3 as "Scheme 1" 40 and "Scheme 2" 41, respectively. One of the compression modes 40 or 41 may be any lossless data compression, such as a dictionary based data compression, for example LZ1, LZ2, ALDC, etc. The other compression mode may comprise another dictionary based data compression, another version of the same data compression, an alternative data compression, or a version of passthrough which primarily passes the data through without alteration.

The switching, or "swap", is indicated by at least one multibit mode switch, or "swap", character. As an example, the "FF.1" control code may be used as the "swap" character. As a further refinement, a byte or partial byte may be added to the control code to provide various control codes indicating, inter alia, as one character, a Scheme 1 to Scheme 2 swap, and as another character, a Scheme 2 to Scheme 1 swap.

The binary format input data is received at input 43 to register 44. The input data is supplied from register 44 to both the Scheme 1 data compressor 40 and the Scheme 2 data compressor 41. Each data compression mode processes the input data and outputs a string of codewords on lines 45 and 46, respectively. The outputted codewords are indicated as valid on lines 47 and 48, respectively, when the processing of each codeword is completed.

In accordance with the present invention, a FIFO determination of the compression efficiency of the input data under each mode is made on an ongoing basis. The ongoing basis may be for each compressed code word or more, and accumulated over an extended reference span. The compressed data codewords on lines 45 and 46 are stored in FIFO buffers 50 and 51, respectively, and one of the FIFO buffer codewords will be utilized in the output data.

Referring additionally to FIG. 2, one of the data compression schemes is the present mode at step 54. The next codewords are encoded in step 62 and tested on the ongoing FIFO basis in step 63. Specifically, each data compressor 40 and 41 supply information related to the length of the codeword on lines 56 and 57, respectively to comparison logic 59 for a FIFO comparison of the compression efficiencies under each mode.

In accordance with the present invention, a straight comparison does not result in switching. Rather, switching between modes takes into account the potential cost of the swap (in terms of the length of the added special character indicating the switch). Specifically, switching between modes does not occur in accordance with the present invention until the savings (in terms of the length of the data saved) in making the swap is likely to meet a threshold which is directly related to the cost of the swap. Thus, the modes for compressing the input data are switched only upon the comparison indicating the compression efficiency of the present mode is less than the compression efficiency of the other mode by the threshold value, the threshold value directly related to the number of bits in the multibit mode switch character.

Hence, comparison logic 59 comprises thresholds "A" 60 and "B" 61 which set thresholds against which the savings are compared. In accordance with the invention, one or more thresholds may be employed, which are directly related to the cost of the swap.

As an example, the first threshold "A" may be the total cost of the swap, which comprises the length of the special control character for switching from the present data compression scheme to the other data compression scheme plus the length of the special control character for switching back. If threshold "A" is met or exceeded by the next codeword of compressed data from the other scheme as compared to the next codeword of the present scheme, it is worth switching modes, and a swap will be conducted. For example, if both special control characters are 13 bits in length, threshold "A" will be set at a value equal to the sum of the characters, equal to 26.

As another example, the second threshold "B" may additionally be related to the length limits of the FIFO comparisons of codewords stored in FIFO buffers 50 and 51, the extended comparison reference span. Thus, if the ongoing comparisons of data compression of the schemes shows there will be a savings, but the comparison cannot be continued without losing the codewords (because the first codeword of only the present scheme will be output from its FIFO buffer 50 or 51 and the codeword of the other scheme lost), it may be worthwhile making the swap. The swap may be worthwhile because the savings are likely to continue to increase if the input data remains similar to that encountered most recently. Thus, the threshold is set at some lower value. As an example, the second threshold "B" may be set at one-half the special control character for switching from the present mode to the other mode. The one-half the special control character length threshold would be a wash with respect to the length of the character if incorrect. At worst, it would cost only the length of the special control character for switching back to the present mode, but that switch back would not be made unless the savings were to also meet or exceed one of the thresholds. Thus, the second threshold "B" is also cost effective and efficient. For example, if the special control character is 13 bits in length, threshold "B" would be a value of 7 (one-half of 13 rounded up). Other suitable values, such as one quarter, etc., may be used.

Referring to FIGS. 2 and 3, the first step 62 is to generate the next compressed codeword for each data compression scheme 40 and 41 and provide the indications of the codeword lengths on lines 56 and 57, respectively. The simplified diagrams of FIGS. 2 and 3 do not show the FIFO controls described hereinafter which control the comparison reference span over unequal numbers of code words. For example, the ongoing comparison of codewords over the same reference span may be the comparison of 1 backward reference to 7 literal codewords. In step 63, comparator 65 compares the codeword lengths and supplies the comparison value to an accumulator 66, which, in step 68, updates any prior accumulated value in the accumulator 66 with the comparison value. For example, if the prior accumulated value is 5 bits, and the comparison in step 63 indicates a further savings of 4 bits, step 68 updates the accumulator 66 to a value of 9 bits.

Comparator 65 and accumulator 66 may take many alternative forms. One approach may be that a comparator that provides positive comparison values for codeword lengths provided from compressor 40 as compared to codeword lengths from compressor 41 and an accumulator that accumulates values from zero until a swap occurs, at which point the comparator and accumulator are reset. The comparator would then be reset to provide positive comparison values for the reverse comparison of codeword lengths provided from compressor 41 as compared to codeword lengths from compressor 40. The accumulator 66 would be reset to zero again and accumulate positive values from zero until a reverse swap occurs.

An alternative approach is to provide a comparator 65 that provides positive comparison values for codeword lengths from compressor 40 as compared to codeword lengths from compressor 41 regardless of the direction of the prospective swap. The accumulator 66 would thus increment from zero when the present mode was scheme 1 from compressor 40 until a swap occurs and the accumulator reset to the maximum threshold level "A" and decrement when the present mode was scheme 2 from compressor 41. This approach is simpler to implement.

As shown in FIGS. 2 and 3, accumulator 66 is, in one embodiment of the invention, provided with at least one clip level 70. One clip level is zero so that only the potential savings are accumulated. (Since the system is in the present mode, there is no need to accumulate potential savings in staying in the same mode). This is the only clip level required in the first approach, above.

In the second approach, a second decrementing clip level equivalent to the incremental zero is the maximum threshold level "A". Thus, a second clip level 70 of the maximum threshold level "A" must be provided.

As described above, two thresholds are provided. Threshold "A" may be the total cost of the swap, which comprises the length of the special control character for switching from the present data compression scheme to the other data compression scheme plus the length of the special control character for switching back. The second threshold "B" is used when the entire FIFO extended reference span has been compared and may be set at one-half the special control character for switching from the present mode to the other mode.

Thus, referring to FIGS. 2 and 3, step 72 operates logic 75 to determine whether the entire FIFO has been compared and is represented in the accumulated value of the accumulator 66. If the entire FIFO has not been compared, "No" in step 72, the maximum threshold "A" 60 is utilized in step 77. If the entire FIFO has been compared, "Yes" in step 72, the lower threshold "B" 61 is utilized in step 78.

Steps 77 and 78 are conducted by comparator and control logic 80. If the entire FIFO has not been compared, comparator and control logic 80 conducts step 77 to apply threshold "A" 60 to the accumulated value. If the accumulated value is less than threshold "A", it would not be cost effective to swap. Therefore, the process cycles back to the next codewords at step 62. If the accumulated value is equal to or greater than the threshold "A", "No", the swap should be made. Similarly, if the entire FIFO has been compared, comparator and control logic 80 conducts step 78 to compare the threshold "B" 61 to the accumulated value. If the accumulated value is less than threshold "B", it would not be cost effective to swap. Therefore, the process resets the accumulator in step 79 and cycles back to the next codewords at step 62. If the accumulated value is equal to or greater than the threshold "B", "No", the potential cost of switching compression modes is small, and may prove cost effective if the input data continues to favor the other mode.

The "No" result of steps 77 or 78 indicate a swap, which is conducted in step 84. The swap codeword is inserted in the output data stream in step 84 by logic circuitry 85, and selector 86 switches the next codeword output from the present compression scheme to the other compression scheme. A bit packer 90 assembles the output data in a continuous stream and provides the output data at output 91.

In step 95, comparator and control logic 80 resets the accumulator and thresholds as necessary. For example, if the first approach accumulator, above, is used, the accumulator is reset to zero after a switch and the direction of accumulation of the comparator output is reset. Thus, the accumulator 66 may have reached only a value of 10 (decimal) when the entire FIFO was compared and the swap made. The accumulator value is then reset to zero and the comparator reset or the accumulator reset to a sign change for the compared codeword lengths of comparator 65. If the second approach accumulator, above, is used, the accumulator 66 is reset after a switch to Scheme 2 to the maximum threshold level, e.g., 26 (decimal), and the thresholds 60 and 61 reset to inverted levels, e.g., threshold "A" becomes zero instead of 26 (decimal), and threshold "B" becomes 19 (decimal) instead of 7.

After the swap and reset, the previous other data compression scheme now becomes the present scheme 54 and the process of FIG. 2 begins again.

A specific example of switching between two specific data compression modes is illustrated in FIGS. 4–9.

The example of a sliding window data compression scheme is ALDC-2, as described in the '878 patent, and is considered the Scheme 1 data compression. A passthrough mode is considered the Scheme 2.

Although any word length may be employed with the present invention, the example of FIGS. 4–9 comprises an input data word length of one 8-bit byte, and output codewords beginning with 8 bits in length for direct passthrough, upwards.

The '878 patent describes in detail an LZ1 ALDC encoder employing a content addressable memory (CAM) for rapid identification of matching substrings in the input data. FIG. 4A illustrates the detail of the ALDC outputs. The literal 8-bit bytes are represented by 9 bits, beginning with a "0". The variable length match tokens or codes (called backward references) begin with a "1", followed by a variable length match length code (e.g., in which "00" represents a match length of 2 bytes, etc.), and a 10 bit match offset (or location) code. Thus, with the smallest match, of 2 bytes in length, the backward reference length is 13 bits, a savings of 3 bits over the 16 bits of uncompressed data.

In the instant example, a 13-bit control code is utilized, which comprises a "1" followed by eight "1" bits representing the hex byte "FF", and followed by a four bit code. The code "0010" is the control code indicating the swap to Scheme 2 data compression.

In ALDC-2, the worst case data expansion is 12.5%, which occurs if no backward references are found and all data is output as literals. The control code is not allowed as a valid match code. In FIG. 4A, the cited savings are versus outputting the same data in passthrough mode, which (as will be seen) assumes that each byte requires 8 bits.

Passthrough is illustrated in FIG. 4B, and, except for the control character, the data is output unmodified. The byte "FF" is chosen for the control character and the data becomes "FF" followed by a "0". The control code is eight "1" bits representing the hex byte "FF", followed by a "1" and the four bit control code. The code "0001" is the control code indicating the swap to Scheme 1 data compression.

In passthrough mode, the worst case expansion is theoretically 12.5% if all of the input data is "FF" in hex bytes, or equivalent, but if this were the case, one would swap to Scheme 1 and output the data as backward references. A random word stream, which is basically incompressible in ALDC, would have an average expansion of only 0.05% (assuming that "FF" only appears once every 256 bytes). For the special case of "FF" data, 9 bits are required for both Scheme 1 and Scheme 2, making it no better to be in one mode than the other if this single symbol is viewed in isolation.

In the present example, the control codes are 13 bits long, so that the cost of switching from a present mode to the other and then back is 26 bits. This means that if an input data stream is encountered which would cost 26 bits to output in comparison to the other scheme, the swap to the other scheme should be made before outputting that string to save the 26 bits. Even if an immediate swap back is required, the cost of switching to and then back is no more than outputting that string in the present scheme. Therefore, threshold "A" is set at 26.

Similarly, if it will not cost anything (0 bits) to output the string in the present scheme, it should be done.

The third case is between the 26 bit switch back and forth cost and 0 bits to stay in the same mode. Considering the hardware FIFO limitation to the ability to see more of the string being compared beyond the FIFO length (the extended reference span), the least costly scheme should be utilized. As described above, in accordance with the present invention, if the cost is one-half the mode switch control code character, the one-half the special control character length threshold would be a wash with respect to the length of the character if incorrect. At worst, it would cost only the length of the special control character for switching back to the present mode, but that switch back would not be made unless the savings were to also meet or exceed one of the thresholds. Thus, with the special control mode switch character of 13 bits, threshold "B" should be a value of 7 (one-half of 13 rounded up).

Figure 5:
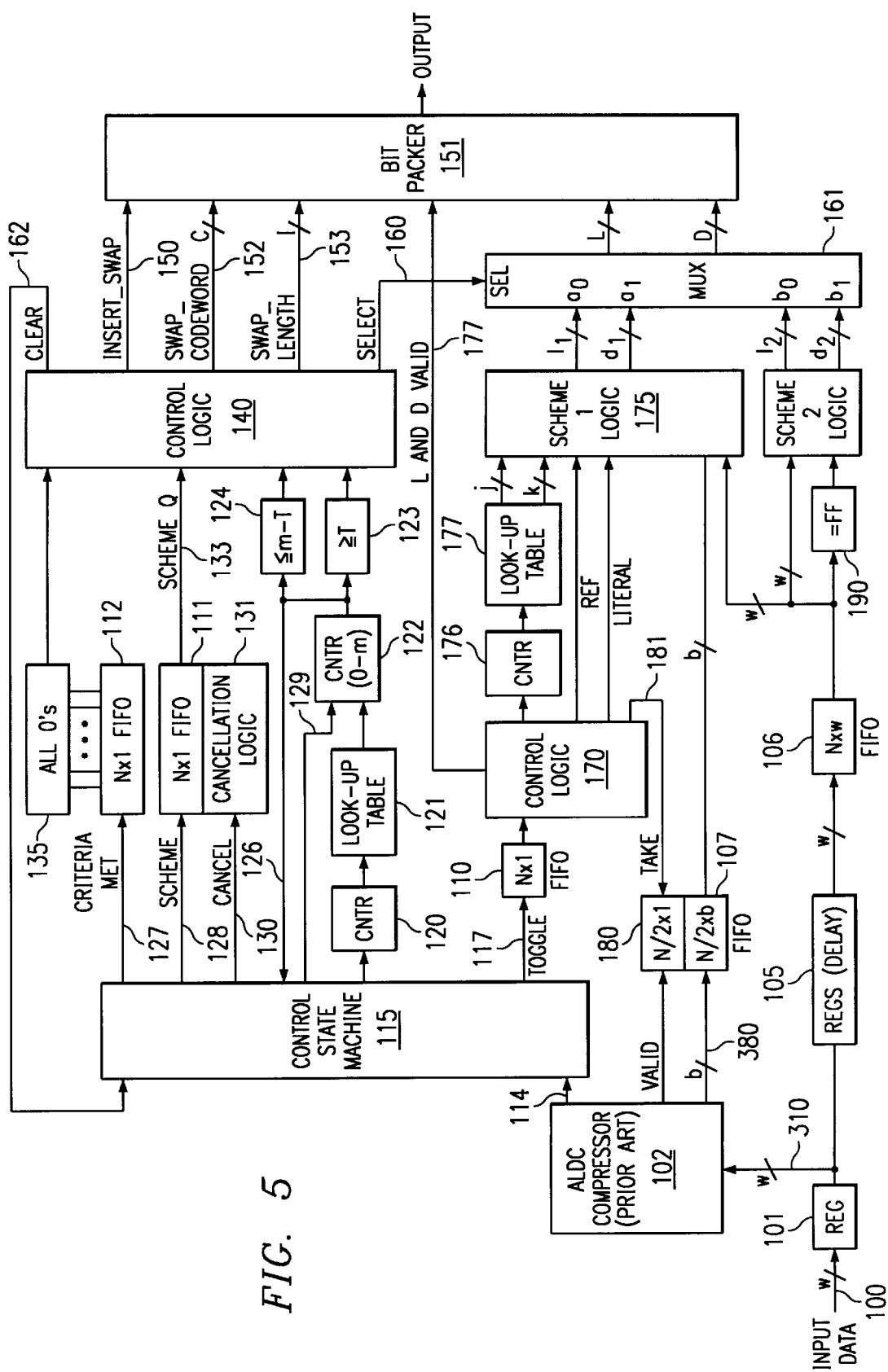
FIG. 5 is a detailed block diagram of apparatus for switching between ALDC LZ1 compression mode and passthrough mode.

With a simple passthrough as Scheme 2, many of the elements of the embodiment of FIG. 3 may be combined or deleted as needed to implement the specific exemplary embodiment of FIG. 5. For example, a passthrough register may be utilized for the data used to form the ALDC literal.

Referring to FIG. 5, input data in the form of words "w" bits wide are received at input 100 at register 101. Although the data may be received as input data in serial or parallel form, it is converted to a parallel form (e.g., 8 bits wide). The input data is supplied to ALDC compressor 102 and to registers 105 which create a delay of the input data equivalent to the operation of the ALDC compressor so that the passthrough data timing will be identical to that of the ALDC token. The present invention provides a FIFO block and decision logic between the ALDC CAM array which is used to determine the ALDC backward reference tokens and the bit packer which outputs the compressed words.

In the embodiment of FIG. 5, the FIFO block stores the outputs of the compression schemes. Three FIFO's are illustrated in the FIFO block, FIFO register 106 is one 8-bit word wide by N deep for uncompressed (passthrough) data, FIFO register 107 is 1+10 bits wide by N/2 deep for offset locations (since the smallest backwards reference is for 2 bytes, N/2 is sufficiently deep), and a FIFO register of 3 bits wide by N deep for control bits, spread over logical registers 110, 111 and 112.

The FIFO lengths may be modified without departing from the spirit of the present invention. For example, if the ALDC-1 LZ1 compression scheme were employed as one of the schemes, the locations stored in register 107 would be only 1+9 bits wide. If the control logic were modified, the number of control bits stored could be altered.

The length "N" of the FIFO determines the length of a string that can be viewed before making a scheme swap decision, and the longer the FIFO, the better the decisions. The example of FIG. 5 assumes a length "N" of the FIFO of at least 7 bytes (threshold "B", the minimum required to be able to switch from ALDC-2 to passthrough) or, alternatively, at least 26 bytes (threshold "A", needed to consider the back and forth switching cost within the length of the FIFO). There is no maximum FIFO length per se. As an example, a specific FIFO length "N" is chosen to be 32.

FIG. 6 illustrates the prior art CAM-based ALDC compressor, of the '878 patent. The CAM array is of B CAM elements, each w bits wide. Each backward reference is resolved into a location of length of b bits on line 380. A write-store shift register 340 identifies the next CAM element to be over-written by incoming data at line 310. A pass-store shift register 350 passes all CAM matches at the beginning of a string match and passes each subsequent CAM match only if it immediately follows a previous CAM match. A save-store latch 355 saves the previous pass-store shift register contents to allow resolver 370 to generate the location b after all CAM match strings terminate as evidenced by the output of OR 365.

Referring to FIG. 5, the location code b is output from the ALDC compressor on line 380 to FIFO register 107, and a valid output is also provided from the control circuitry of the ALDC to FIFO register 180 to provide a bit indicating the validity of the accompanying location code. The output of OR 365 is also provided on line 114 to a control state machine 115 of the present invention. The control state machine 115 receives the OR output and processes it to create a Toggle 117 which encodes the string lengths to which the data words in FIFO 106 correspond. The length that the Toggle is in the same state corresponds to the string length. For example, Toggle "0010110001" encodes the end of a string via the "00", a one word match (or literal) via the "1", another one word match via the "0", a two word backward reference via the "11", and a three word backward reference via the "000".

Counter 120 also monitors an output of the control state machine 115 to give a count of the string match length. Its output count is the input address to a lookup table 121 which gives the sign and magnitude of the update to the accumulating counter 122. For example, the lookup table may result in a +1 count instruction when a literal is found, and a 0 and the −3 as the two count instructions corresponding to a 2 byte backward reference.

Counter 122 is a special up/down accumulating counter which allows updates of various magnitudes, and which truncates the count from going below 0 or above threshold "A" ("A", as above, is the length of the swap to Scheme 2 codeword (13 bits) plus the length of the swap to Scheme 1 codeword (13 bits) for a total of 26 bits). The output count is monitored by two comparators 123 and 124. Comparator 123 identifies if the count is greater than or equal to threshold "B", which in the example is 7 (half of 13 rounded up), for a swap to Scheme 2; and comparator 124 identifies if the count is less than or equal to threshold "B" in the inverse direction (26−7=19) for a swap to Scheme 1.

The output count is also supplied on output 126 so that control state machine 115 can identify when the count reaches either 26 or 0.

The control state machine 115 has three other outputs. CriteriaMet 127 is set whenever the count reaches 26 when presently in Scheme 1 mode, indicating a swap to Scheme 2 can be justified on savings already seen, or if the count reaches 0 when presently in Scheme 2 mode, indicating a swap to Scheme 1 can be justified on savings already seen. Scheme 128 is the tentative scheme which a given data byte will be output as if the scheme switches. For example, when in Scheme 1, Scheme 128 will tentatively slate any literals as the start of a sequence which should be changed to Scheme 2 before being output. In this case, if backward references are seen which eliminate any savings seen (forcing counter 122 to 0 at line 129), then the tentative scheme swap is canceled. This is accomplished by setting Cancel 130 which operates circuit 131 to cancel any scheme swap from the present state up to the beginning of that sequence. Any tentative scheme swaps which are not canceled result in a transition on SchemeQ 133, at the output of the FIFO.

A transition on SchemeQ 133 signals control logic 140 to make a decision if the scheme swap is well advised. If all CriteriaMet 127 bits in FIFO 112 are "0", as indicated by circuit 135, it indicates that the scheme swap is not guaranteed to give good results. In this example, one of the two comparators 123 and 124 (the relevant one for the given proposed scheme swap) is monitored and the switch only proceeds if it is active.

Using these inputs, control logic 140 acts on a SchemeQ 133 transition by either accepting it or rejecting it. In the accept case, it activates the insert__swap line 150 to the bit packer 151, and passes the swap__codeword and the swap__length (for the case that the two swap codewords are not the same length) to the bit packer 151 on outputs 152 and 153, respectively. Control logic 140 also changes the Select line 160 to the scheme multiplexor 161.

In the case of a rejection (the high criteria "A" was not met (no CriteriaMet) and the low criteria "B" determined by the comparator is not met), then a Clear line 162 is activated to restart the counter 122 (the count becomes invalid as the data to which it corresponds is shifted out of FIFO 106) at the appropriate count given the present state (0 for Scheme 1, 26 for Scheme 2), and the tentative Scheme transition is canceled via Cancel 130.

Control logic 170 interprets the Toggle 110 stream and derives the Reference and Literal control lines to the Scheme 1 logic 175. In the case of a reference, the length of the string is measured by counter 176 and the match length code is found via look-up table 177 which outputs a code k, and the length of the code j. These are parsed together with the location b from FIFO 107 by the Scheme 1 logic 175 into the appropriate backward reference which is output on $l_1$ and $d_1$. The single cycle that they are valid in a backward reference is signified by the L&D Valid line 177 from the control logic 170 to the bit packer 151.

The location pointer for a backward reference can be output into an N by b shift register, or can be reduced to an N/2 FIFO 107 by use of a 1 bit valid FIFO 180 which signifies which FIFO locations are occupied and thus allow selective propagation. The Take line 181 from control logic 170 overrides the valid bit of the last FIFO location and allows it to be over-written (after the data corresponding to it was latched).

The data required for output in Scheme 2 is provided solely by FIFO 106 with the help of a comparator 190 which checks if the given byte happens to correspond to the control sequence (in this case "FF" in hex). In Scheme 2, $l_2$ is either 8 (the usual case) or 9 for the control sequence. The output on $d_2$ is just the 8 bits out of FIFO 106 or the 9 bits representing the control sequence.

The bit packer 151 collects the various compression codewords and packs them into some bus width usable outside the compressor. For example, in Scheme 1, a given compression symbol can be 9 bits long (in the case of a literal), 13 bits long (in the case of either a 2 or 3 byte backward reference in ALDC-2 mode), etc., but the logic following the compressor may require a 2 byte wide bus.

As an example, the operation of the circuitry of FIG. 5 assumes the following initial conditions: the starting compression mode is Scheme 1 (ALDC mode), with a reset history buffer, the cost counter 122 will start at 0, and the FIFO'd Toggle 110 is 0 at all locations. The cost counter 122 is incremented up by 1, indicating the cost of each literal of Scheme 1 with respect to the passthrough data. A down count can be of various sizes, depending on the bit savings of backward references (see FIG. 4A).

Counter 122 is clipped at either 0 or 26. The counter 122 can also be held at the present count in the case of no cost (e.g., outputting "FF"). The counter can also be reset to 0 or set to 26. The three FIFO sets of control bits are Toggle 110 (an encoded CAM array output which changes state to indicate transitions between output events in ALDC mode), Scheme 111 which indicates the tentative scheme recommended by the count when the data enters the FIFO ("1"= Scheme 1, "0"=Scheme 2), and CriteriaMet 112 which indicates that the automatic switch criteria was met.

As an alternative, the three control lines could be pared to two by elimination of CriteriaMet and encoding this information onto Scheme. This is possible since Scheme states always span multiple bits, a 1 bit Scheme state can be used to signify CriteriaMet and otherwise ignored as far as Scheme goes. E.g., the two lines:

Scheme 222211111
CriteriaMet 000100000 could be combined into:

Combined 221211111.

Such a combination would save some silicon, but the conceptually simpler three control line interface will be described.

For simplicity of illustration, the FIFO depth is set at a level of 32, slightly greater than the 26 count of threshold "A", and substantially less than the history buffer (which is typically 512 or 1K bytes).

Three scenarios will be utilized to describe the operation. In scenario A, illustrated in FIG. 7, the input data stream "Mississuppi abcdefghijklmnopqrstuv is her Missis" is received at input 100.

At startup, the ALDC Scheme 1 must treat the first incoming data as a literal. With an initial count of 0, counter 122 is incremented with each literal (which would include the output of the first 4 bytes "Miss") and any non-zero count could potentially be the beginning of a string which should be swapped to Scheme 2, thus the Scheme line 128 is set to "2". The subsequent receipt of a 3 byte backward reference (for "iss") decrements the count until it seems it should go negative (it does not because it is clipped at "0"). At this point, it is clear that the tentative swap to Scheme 2 for the literals which preceded it was ill advised and using logic which propagates to where the tentative swap began in the FIFO, the tentative swap is canceled.

Immediately thereafter, a string of 28 literals is received. This causes the count of counter 122 to reach 26 (the count does not exceed 26 because it is again clipped), and it is desirable to swap. Thus the control logic flip flop state is set to Scheme 2 (passthrough). Then, backward reference 2 is encountered and becomes the potential beginning of a swap back to Scheme 1. Note that because "Ref2" is the potential start of a swap back, it is immediately tagged as a tentative Scheme 1. Contrast this to "Ref1", which was received when the logic was still evaluating a string as a potential swap to Scheme 2, and hence it was tagged as tentative Scheme 2 until the count hit 0 and the tentative swap was canceled. The difference with "Ref2" is the state flip flop in the control logic. Shortly thereafter, "Ref3" is received and, unlike "Ref2", has sufficient magnitude to secure a swap back to Scheme 1.

Scenario B illustrated in FIG. 8 is of a slightly different string. In this scenario, the 32 FIFO fills up before a change in state is secured and the count 123 must be interrogated to determine whether a swap should occur. Because the count is "6", which is less than 7 (the decision threshold "B"), the tentative swap to Scheme 1 is NOT executed (and the cost of 6 is borne out).

Scenario C illustrated in FIG. 9 is of a slightly different string. In this scenario, the 32 FIFO also fills up before a change in state is secured and the count 123 must be interrogated to determine whether a swap should occur. Because the count is "11", which is more than 7 (the decision threshold "B"), the tentative swap to Scheme 1 IS executed (and the effective cost is 13 bits to swap minus the 11 bits saved by the swap, yielding a net cost of 2 bits).

Scenario A (FIG. 7) illustrates that even when the counter 122 is fully biased towards Scheme 2 (at 26), a 6 byte backward reference (see "Ref3") is enough to force it to switch to Scheme 1. Thus, any backward reference 6 bytes or longer forces Scheme 1.

In the illustrated example, a FIFO comparison of the compression efficiencies under the ALDC and passthrough modes are made, and the modes for compressing the input data are switched only upon the comparison indicating the accumulated compression efficiency of the present mode is greater than the compression efficiency of the other mode by a threshold value "A" for less than the full FIFO length or a threshold value "B" upon reaching the full FIFO length. The threshold values 'A' and "B" are directly related to the number of bits in the multibit mode switch character.

The present invention is readily extensible to multiple compression techniques, or versions of the same technique. For example, swaps could be made between ALDC-1 and ALDC-2 because of differences in compression efficiency due to the longer (10 bit versus 9 bit) buffer of ALDC-2 sometimes increases and sometimes lowers compression efficiency.

While the preferred embodiments of the present invention have been illustrated in detail, it should be apparent that modifications and adaptations to those embodiments may occur to one skilled in the art without departing from the scope of the present invention as set forth in the following claims.

I claim:

1. A method for switching between lossless data compression modes, from the one of said modes which is presently used for preceding binary format input data (present mode) to the other of said modes (other mode) for present binary format input data, said switching indicated by at least one multibit mode switch character having a number of bits, comprising the steps of:

receiving said present binary format input data;

FIFO determining compression efficiency of said present input data under each of said modes on an ongoing basis;

FIFO comparing said compression efficiencies for said present input data under each of said modes; and switching from said present mode to said other mode for compressing said present input data for which said compression efficiency is determined in said FIFO determining step only upon said FIFO comparing step indicating said compression efficiency of said present mode being less than said compression efficiency of said other mode by a threshold value, said threshold value directly related to said number of bits in said multibit mode switch character.

2. The method of claim 1, wherein one of said data compression modes comprises a Lempel-Ziv based compression for compressing said input data into variable sized tokens; and wherein said FIFO compression efficiency determination step comprises determining a bit length of each of said variable sized tokens.

3. The method of claim 1, wherein said FIFO comparison step comprises accumulating said comparisons of compression efficiencies; and wherein said switching step comprises switching from said present mode to said other mode upon said accumulated compression efficiencies of said present mode being less than said accumulated compression efficiencies of said other mode by said threshold value.

4. The method of claim 3, wherein said FIFO comparison step comprises resetting said accumulated comparisons to zero in response to said switching step switching between modes.

5. The method of claim 3, wherein said data compression modes each provides an output word or token and wherein said FIFO comparison step is conducted for each said word or token of said data compression modes, and said comparisons are accumulated.

6. The method of claim 5, wherein said threshold value comprises two values, a first higher threshold value for efficiency comparisons for present input data of length less than a string length of a FIFO buffer, and a second lower threshold value for efficiency comparisons for present input data equal to said string length.

7. The method of claim 6, wherein said first higher threshold value is equal to a sum of the number of bits in said multibit mode switch characters to switch back and forth, and said second lower threshold value is equal to half (rounded up) the number of bits in said multibit mode switch character.

8. The method of claim 3, wherein one of said data compression modes comprises a Lempel-Ziv compression for compressing said input data into variable sized tokens; and wherein said FIFO compression efficiency determination step comprises determining a bit length of each of said variable sized tokens.

9. The method of claim 8, wherein the other of said data compression modes comprises a passthrough mode.

10. The method of claim 9, wherein said passthrough mode excludes one control code symbol from literal passthrough to provide said at least one multibit mode switch character.

11. The method of claim 9, wherein said FIFO compression efficiency determination step of said Lempel-Ziv data compression is conducted by table lookup.

12. The method of claim 8, wherein said Lempel-Ziv data compression mode provides said output tokens and said passthrough mode provides output words, and wherein said FIFO comparison step is conducted for each said word or token of said data compression modes, and said comparisons are accumulated.

13. The method of claim 12, wherein said threshold value comprises two values, a first higher threshold value for efficiency comparisons for present input data of length less than or equal to a string length of a FIFO buffer, and a second lower threshold value for efficiency comparisons for present input data equal to said string length.

14. The method of claim 13, wherein said first higher threshold value is equal to a sum of the number of bits in said multibit mode switch characters to switch back and forth, and said second lower threshold value is equal to half (rounded up) the number of bits in said multibit mode switch character.

15. A data compression apparatus for switching between lossless data compression modes, from the one of said modes which is presently used on preceding binary format input data (present compression mode) to the other of said modes (other compression mode) for present binary format input data, indicating said switching with at least one multibit mode switch character having a number of bits, comprising:

an input for receiving said present binary format input data;

a first lossless data compressor coupled to said input for providing a first data compression of said present input data according to a first compression mode and providing an output of said present input data in said first compression mode;

a second lossless data compressor coupled to said input for providing a second data, compression of said input data according to a second compression mode and providing an output of said present input data in said second compression mode;

comparison logic coupled to said first and said second compressors, said comparison logic compares on an ongoing FIFO basis compression efficiency between said first and said second lossless data compressors in compressing said present input data, providing an efficiency comparison output, and wherein said comparison logic additionally compares said efficiency comparison output between said present compression mode and said other compression mode with a threshold value, said threshold value directly related to said number of bits in said multibit mode switch character, and wherein said comparison logic additionally providing a signal upon said efficiency comparisons exceeding said threshold value; and a compression output selector coupled to said comparison logic and said first and said second compressors for selecting said output from one of said first and said second compressors at a time, and, upon said comparison logic providing said signal, switching between the one of said first and said second compressors in said present compression mode to the one of said first and said second compressors of said other compression mode, for said output of said present input data for which said comparison was made, and signaling said switch between said first and said second compressors by outputting said at least one multibit mode switch character.

16. The data compression apparatus of claim 15, wherein said comparison logic additionally comprises an accumulator for accumulating each said efficiency comparison and provides said efficiency comparison output, and wherein said comparison logic compares said accumulated efficiency comparison output with said threshold value.

17. The data compression apparatus of claim 16, wherein said accumulator is reset to zero upon said comparison logic providing said signal.

18. The data compression apparatus of claim 16, wherein said first lossless data compressor is a Lempel-Ziv based compressor for compressing said present input data into variable sized tokens; and wherein said comparison logic efficiency comparison compares a bit length of each of said variable sized tokens to a corresponding bit length of said second lossless data compressor compression.

19. The data compression apparatus of claim 16, wherein said data compression modes each provides an output word or token and wherein said comparison logic conducts said FIFO comparison for each said word or token of said data compression modes, and said accumulator accumulates the results of said FIFO comparisons.

20. The data compression apparatus of claim 19, wherein said threshold comprises two threshold values, a first higher threshold value for efficiency comparisons for present input data having a string length less than or equal to that identified by a FIFO buffer, and a second lower threshold value for efficiency comparisons for present input data having a string length greater than that identified by said FIFO buffer.

21. The data compression apparatus of claim 20, wherein said first higher threshold value is equal to a sum of the number of bits in said multibit mode switch characters to switch back and forth, and said second lower threshold value is equal to half (rounded up) the number of bits in said multibit mode switch character.

22. The data compression apparatus of claim 20, wherein said first lossless data compressor is a Lempel-Ziv compressor for compressing said present input data into variable sized tokens; and wherein said comparison logic efficiency comparison compares a bit length of each said variable sized token to a corresponding bit length of said second lossless data compressor compression.

23. The data compression apparatus of claim 22, wherein the other of said data compression modes comprises a passthrough mode.

24. The data compression apparatus of claim 23, wherein said passthrough data compression excludes one control code symbol from literal passthrough to provide said at least one multibit mode switch character.

* * * * *